(12) United States Patent
Sakai et al.

(10) Patent No.: US 7,015,511 B2
(45) Date of Patent: Mar. 21, 2006

(54) GALLIUM NITRIDE-BASED LIGHT EMITTING DEVICE AND METHOD FOR MANUFACTURING THE SAME

(75) Inventors: Shiro Sakai, Tokushima (JP); Tao Wang, Tokushima (JP)

(73) Assignees: Nitride Semiconductors Co., Ltd., Naruto (JP); Shiro Sakai, Tokushima (JP)

( * ) Notice: Subject to any disclaimer, the term of this patent is extended or adjusted under 35 U.S.C. 154(b) by 96 days.

(21) Appl. No.: 10/184,305

(22) Filed: Jun. 27, 2002

(65) Prior Publication Data

US 2003/0016526 A1    Jan. 23, 2003

(30) Foreign Application Priority Data

Jun. 29, 2001    (JP) ............................... 2001-198304

(51) Int. Cl.
   *H01L 29/22*    (2006.01)
(52) U.S. Cl. ............................... 257/94; 257/96; 257/97
(58) Field of Classification Search ................. 257/94, 257/96, 97
   See application file for complete search history.

(56) References Cited

U.S. PATENT DOCUMENTS

| | | | |
|---|---|---|---|
| 3,909,929 A | 10/1975 | Debesis ........................ 29/590 |
| 4,985,113 A | 1/1991 | Fujimoto et al. ............ 156/643 |
| 5,332,697 A | 7/1994 | Smith et al. ................. 437/242 |
| 5,429,954 A | 7/1995 | Gerner | |
| 5,633,192 A | 5/1997 | Moustakas et al. | |
| 5,652,438 A | 7/1997 | Sassa et al. | |
| 5,717,226 A | 2/1998 | Lee et al. ..................... 257/86 |
| 5,767,581 A | 6/1998 | Nakamura et al. .......... 257/749 |
| 5,786,233 A | 7/1998 | Taskar et al. ................ 438/46 |
| 5,787,104 A | 7/1998 | Kamiyama et al. | |
| 5,804,918 A | 9/1998 | Yazawa et al. ............. 313/506 |
| 5,874,747 A | 2/1999 | Redwing et al. .............. 257/77 |
| 5,880,485 A * | 3/1999 | Marx et al. .................... 257/94 |
| 5,888,886 A | 3/1999 | Sverdlov et al. ............ 438/505 |
| 5,900,650 A | 5/1999 | Nitta ............................ 257/94 |
| 5,929,466 A | 7/1999 | Ohba et al. ................. 257/103 |
| 6,030,848 A | 2/2000 | Yuge et al. .................... 438/46 |
| 6,090,666 A | 7/2000 | Ueda et al. ................. 438/257 |
| 6,103,604 A | 8/2000 | Bruno et al. ................ 438/584 |
| 6,172,382 B1 | 1/2001 | Nagahama et al. ........... 257/94 |
| 6,177,684 B1 | 1/2001 | Sugiyama | |
| 6,191,436 B1 | 2/2001 | Shibata et al. ................ 257/91 |
| 6,242,328 B1 | 6/2001 | Shin ............................ 438/518 |
| 6,261,862 B1 | 7/2001 | Hori et al. .................... 438/96 |
| 6,277,665 B1 | 8/2001 | Ma et al. | |
| 6,355,945 B1 | 3/2002 | Kadota et al. ................ 257/82 |

(Continued)

FOREIGN PATENT DOCUMENTS

EP    0 180 222 A2    5/1986

(Continued)

OTHER PUBLICATIONS

Japanese Patent Application Serial No. 2000-358412 Office Action dated May 27, 2003.

(Continued)

*Primary Examiner*—Sara Crane
(74) *Attorney, Agent, or Firm*—Osha Liang LLP

(57) ABSTRACT

For a light emitting device using gallium nitride (GaN), on a substrate are sequentially formed a GaN-based layer, an AlGaN-based layer, and a light emitting layer. To prevent cracks in the AGaN-based layer, the AlGaN-based layer is formed before planarization of the surface of the GaN layer on a surface of the GaN layer which is not planar. For a laser, the AlGaN-based layers serve as clad layers which sandwich the light emitting layer.

14 Claims, 4 Drawing Sheets

U.S. PATENT DOCUMENTS

| | | | |
|---|---|---|---|
| 6,399,966 B1 * | 6/2002 | Tsuda et al. | 257/103 |
| 6,423,984 B1 | 7/2002 | Kato et al. | 257/103 |
| 6,429,102 B1 | 8/2002 | Tsai et al. | 438/508 |
| 6,455,337 B1 | 9/2002 | Sverdlov | 438/22 |
| 6,465,808 B1 | 10/2002 | Lin | 257/81 |
| 6,617,182 B1 * | 9/2003 | Ishida et al. | 438/22 |
| 6,657,236 B1 * | 12/2003 | Thibeault et al. | 257/98 |
| 2002/0036286 A1 | 3/2002 | Ho et al. | 257/11 |
| 2002/0042159 A1 | 4/2002 | Chiyo et al. | 438/46 |
| 2002/0043890 A1 | 4/2002 | Lu et al. | 310/313 O |
| 2003/0178634 A1 | 9/2003 | Koide | |
| 2004/0026704 A1 | 2/2004 | Nikolaev et al. | |
| 2004/0051105 A1 | 3/2004 | Tsuda et al. | |
| 2005/0168798 A1 | 8/2005 | Mushika et al. | |

FOREIGN PATENT DOCUMENTS

| | | |
|---|---|---|
| EP | 0 180 222 A3 | 5/1986 |
| EP | 0 497 350 B2 | 8/1992 |
| EP | 0 723 303 A2 | 7/1996 |
| EP | 0 731 490 A2 | 9/1996 |
| EP | 0 723 303 A3 | 5/1997 |
| EP | 0779 666 A2 | 6/1997 |
| EP | 0 731 490 A3 | 3/1998 |
| EP | 0 942 459 A1 | 9/1999 |
| JP | 4-297023 | 10/1992 |
| JP | 4-288871 | 8/1993 |
| JP | 6-291366 | 10/1994 |
| JP | 407263408 A | 10/1995 |
| JP | 9-17975 | 1/1997 |
| JP | 9-227298 | 9/1997 |
| JP | 10-22568 | 1/1998 |
| JP | 10-163525 | 6/1998 |
| JP | 10-312971 | 11/1998 |
| JP | 10-321913 | 12/1998 |
| JP | 11-111867 | 4/1999 |
| JP | 11-135832 | 5/1999 |
| JP | 11-145057 | 5/1999 |
| JP | 11-145516 | 5/1999 |
| JP | 11-266004 | 9/1999 |
| JP | 0 961 328 A2 | 12/1999 |
| JP | 11-346032 | 12/1999 |
| JP | 11-346035 | 12/1999 |
| JP | 11-354839 | 12/1999 |
| JP | 11-354840 | 12/1999 |
| JP | 11-354842 | 12/1999 |
| JP | 2000-21789 | 1/2000 |
| JP | 2000-91252 | 3/2000 |
| JP | 2000-91253 | 3/2000 |
| JP | 2000-174344 | 6/2000 |
| JP | 2000-357820 | 12/2000 |
| WO | WO98/42030 | 9/1998 |
| WO | WO98/44569 | 10/1998 |

OTHER PUBLICATIONS

U.S. Appl. No. 10/139,863 Office Action dated May 23, 2003.
Taiwanese Patent Application Serial No. 091100294 Office Action dated Mar. 14, 2003.
Japanese Patent Application Seirial No. 2000-289103 Office Action dated Apr. 22, 2003.
European Search Report dated Nov. 27, 2002 (4 pages).
Patent Abstracts of Japan, Publication No. 07097300, Publication Date Apr. 11, 1995, 1 page.
Patent Abstracts of Japan, Publication No. 10178213, Publication Date Jun. 30, 1998, 1 page.
Patent Abstracts of Japan, Publication No. 10242061, Publication Date Sep. 11, 1998, 1 page.
Patent Abstracts of Japan, Publication No. 11186174, Publication Date Jul. 9, 1999, 1 page.
Patent Abstracts of Japan, Publication No. 11274557, Publication Date Oct. 8, 1999, 1 page.
Patent Abstracts of Japan, Publication No. 2000306854, Publication Date Nov. 2, 2000, 1 page.
European Search Report dated Nov. 11, 2002, 4 pages.
European Search Report dated Jan. 8, 2003, 3 pages.
English/Japanese Notice of Grounds For Rejection, Japanese Patent Application Serial No. 2000-227963, 7 pages.
English/Japanese Notice of Grounds for Rejection, Japanese Patent Application Serial No. 2000-164349, 4 pages.
Patent Abstract of Japanese Patent No. JP10312971, published Nov. 24, 1998, 1 page.
Patent Abstract of Japanese Patent No. JP2000021789, published Jan. 21, 2000, 1 page.
Patent Abstract of Japanese Patent No. JP11354839, published Dec. 24, 1999, 1 page.
Patent Abstract of Japanese Patent No. JP11354840, published Dec. 24, 1999, 1 page.
Patent Abstract of Japanese Patent No. JP11354842, published Dec. 24, 1999, 1 page.
Patent Abstracts of Japan, Publication No. 09227298A, published Sep. 2, 1997, 1 page.
Patent Abstracts of Japan, Publication No. 10022568A, published Jan. 23, 1998, 1 page.
Patent Abstracts of Japan, Publication No. 11135832A, published May 21, 1999, 1 page.
Patent Abstracts of Japan, Publication No. 11145057A, published May 28, 1999, 1 page.
Patent Abstracts of Japan, Publication No. 11145516A, published May 28, 1999, 1 page.
Patent Abstracts of Japan, Publication No. 11346032A, published Dec. 14, 1999, 1 page.
Patent Abstracts of Japan, Publication No. 11346035A, published Dec. 14, 1999, 1 page.
Patent Abstracts of Japan, Publication No. 2000091252A, published Mar. 31, 2000, 1 page.
Patent Abstracts of Japan, Publication No. 2000091253A, published Mar. 31, 2000, 1 page.
Patent Abstracts of Japan, Publication No. 2000357820A, published Dec. 26, 2000, 1 page.
Patent Abstract of Japanese Patent No. JP4297023 corresponding to European Patent No. EP0497350, published Aug. 5, 1992, 1 page.
"InGaN/GaN/AlGaN-based laser diodes with modulation-doped strained-layer superlattices grown on an epitaxially laterally overgrown GaN substrate", Shuji Nakamura et al. Appl. Phys. Lett. 72(2), Jan. 12, 1988 1998 American Insitute of Physics, 3 pages.
"Influence of sapphire nitridation on properties of gallium nitride grown by metalorgainc chemical vapor deposition", S. Keiler et al. Appl. Phys. Lett. 68 (11), Mar. 11, 1996 1996 American Institute of Physics, 3 pages.
"The effect of the Si/N treatment of a nitridated sapphire surface on the growth mode of GaN in low-pressure metalorganic vapor phase epitary", S. Haffouz et al. Applied Physics Letters, vol. 73, No. 9, Aug. 31, 1998, 3 pages.
"Growth of high-quality GaN by low-pressure metal-organic vapour phase epitaxy (LP-MOVPE) from 3D islands and lateral overgrowth", H. Labreche et al. N.H Elsevier Journal of Crystal Growth 205 (1999) 245-252, 8 pages.
"Optimization of Si/N Treatment Time of Sapphire Surface and Its Effect on the MOVPE GaN Overlayers", S. Haffouz et al. phys. stat. sol. (a) 176, 677 (1999), 5 pages.
"Influence of in situ sapphire surface preparation and carrier gas on the growth mode of GaN in MOVPE" P. Vennegues et al. N.H. Elsevier Journal of Crystal Growth 187 (1998) 167-177, 11 pages.

Patent Abstracts of Japan, Publication No. 11111867, Publication Date Apr. 23, 1999, (1 page).

S. Sakai, et al., "A New Method of Reducing Dislocation Density in GaN Layer Grown on Sapphire Substrate by MOVPE". Journal of Crystal Growth 221 (2000), pp. 334-337.

Kikuo Tominaga, et al. "Preparation of Conductive ZnO:Al Films by a Facing Target System with a Strong Magnetic Field", Thin Solid Films 253 (1994) (pp. 9-13).

Matthew Joseph, et al., "P-Type Electrical Conduction in ZnO Thin Films by Ga and N Codoping", Jpn. J. Appl. Phys., vol. 38 (1999) (pp. L1205-L1207).

Excerpt from the Workbook of the "The Tenth International Conference on Metalorganic Vapor Phase Epitaxy", Hokkaido University,Jun. 5-9, 2000(5 pgs).

European Search Report (4pages); dated Feb. 28, 2002.

Patent Abstracts of Japan, Publication No. JP11068256, Publication Date Mar. 9, 1999, (1 page).

Japanese Patent, Publication No. 11-68256, dated Mar. 9, 1999 (11 pages).

* cited by examiner

GALLIUM NITRIDE-BASED LIGHT EMITTING DEVICE AND METHOD FOR MANUFACTURING THE SAME

BACKGROUND OF THE INVENTION

1. Field of the Invention

The present invention relates to a gallium nitride-based light emitting device and a manufacturing method for the same, and in particular to a device with fewer cracks and a method of suppressing formation of cracks.

2. Description of the Related Art

Gallium nitride (GaN)-based compound semiconductors are applied to short wavelength light emitting devices, such as LEDs.

For efficient enclosure of light in a light emitting devices of an LED, a laser, and so forth, an AlGaN layer having a thickness 0.4 μm or greater or a strained layer super lattice layer constituting of alternately stacked AlGaN and GaN is grown on a GaN layer. Because an AlGaN layer has a smaller refractive index than that of a GaN layer, sandwiching the light emitting layer by AlGaN layers encloses light from the light emitting layer within the light emitting layer.

FIG. 5 shows a structure of a general short wavelength light emitting device (370 nm to 450 nm). Specifically, an n-GaN layer 12 having a thickness 1 μm or greater is formed on a sapphire substrate 10, an n-AlGaN layer having a thickness of approximately 0.5 μm is formed as an n-clad 14 on the n-GaN layer 12, an InGaN layer is formed as an active layer 16 on the n-AlGaN layer, and an AlGaN layer is formed as a p-clad layer 18 on the InGaN layer. That is, the light emitting layer 16 made of InGaN is sandwiched by the clad layers 14 and 18. In such a structure, light from the active layer 16 is reflected by the clad layers 14 and 18, thus enclosed in the active layer 16.

However, because a lattice constant of AlGaN, the material of the clad layers, is smaller than that of GaN, lateral tensile stress is caused in the AlGaN layer as indicated by the arrows in the drawing. Larger tensile stress is caused in a thicker AlGaN layer, and tensile stress in excess of a critical value causes a crack 14a to form.

Japanese Patent Laid-open Publication No. Hei 11-68256 proposes formation of an InGaN layer and formation thereon of an AlGaN layer serving as a crack preventing layer.

FIG. 6 shows a structure of a light emitting device including an InGaN layer. A difference from the structure of FIG. 4 lies in that an InGaN crack preventing layer 13 is formed between the n-GaN layer 12 and the n-clad layer 14. The crack preventing layer 13 has a thickness in the range of between 10 nm and 0.5 μm. In the publication, it is explained that this range is selected because a thickness thinner than 10 nm will have little effect on crack prevention and a thickness larger than 0.5 μm may affect the crystals themselves.

Such a crack preventing layer 13, however, can prevent cracks only when the AlGaN clad layer has a thickness approximately 0.5 μm or less. Cracks may be caused in an AlGaN clad layer which is thicker than this value. Moreover, when InGaN is used for a crack preventing layer 13, (UV) light from the active layer 16 is absorbed by the InGaN, and light emitting efficiency is thereby deteriorated.

SUMMARY OF THE INVENTION

The present invention aims to provide a light emitting device which suppresses the formation of cracks, and a method for manufacturing such a light emitting device.

According to the present invention, there is provided a gallium nitride-based light emitting device, comprising a substrate; a GaN-based layer formed on the substrate; an AlGaN-based layer formed on the GaN-based layer; and a light emitting layer formed on the AlGaN-based layer. The surface of the GaN-based layer at a boundary relative to the AlGaN-based layer is uneven, that is not smooth or planar.

More specifically, an AlGaN-based layer is formed on a GaN-based layer which has not yet grown enough to have a planar surface, rather than on a GaN-based layer which has grown sufficiently to have a planar surface. Because the surface of the GaN-based layer is non-planar, the surface of the AlGaN-based layer formed on the GaN-based layer is also not planar at an early stage of the formation, and therefore a plurality of inclined faces are formed. Accordingly, stress is not concentrated in a direction parallel to the layer, but is also created and transmitted in directions along the inclined faces. Therefore, the compound stress vector over the whole AlGaN-based layer is smaller than when an AlGaN-based layer is formed on a planar surface of a GaN-based layer. Cracks can therefore be prevented, in thicker AlGaN-based layers. It should also be noted that the AlGaN-based layer may be a strained layer super lattice layer, or a SLS layer, instead of a single AlGaN layer.

In one embodiment, a GaN-based layer is a GaN layer, and clad layers which sandwich the light emitting layer are formed on the GaN layer. The clad layers contain AlGaN.

The present invention can be more clearly understood with reference to the following description of embodiments, to which the present invention is not limited.

BRIEF DESCRIPTION OF THE DRAWINGS

The above and other objects, features, and advantages of the present invention will become further apparent from the following description of the preferred embodiment taken in conjunction with the accompanying drawings wherein.

DESCRIPTION OF THE PREFERRED EMBODIMENT

In the following, an embodiment of the present invention will be described based on the drawings.

Figure 1:
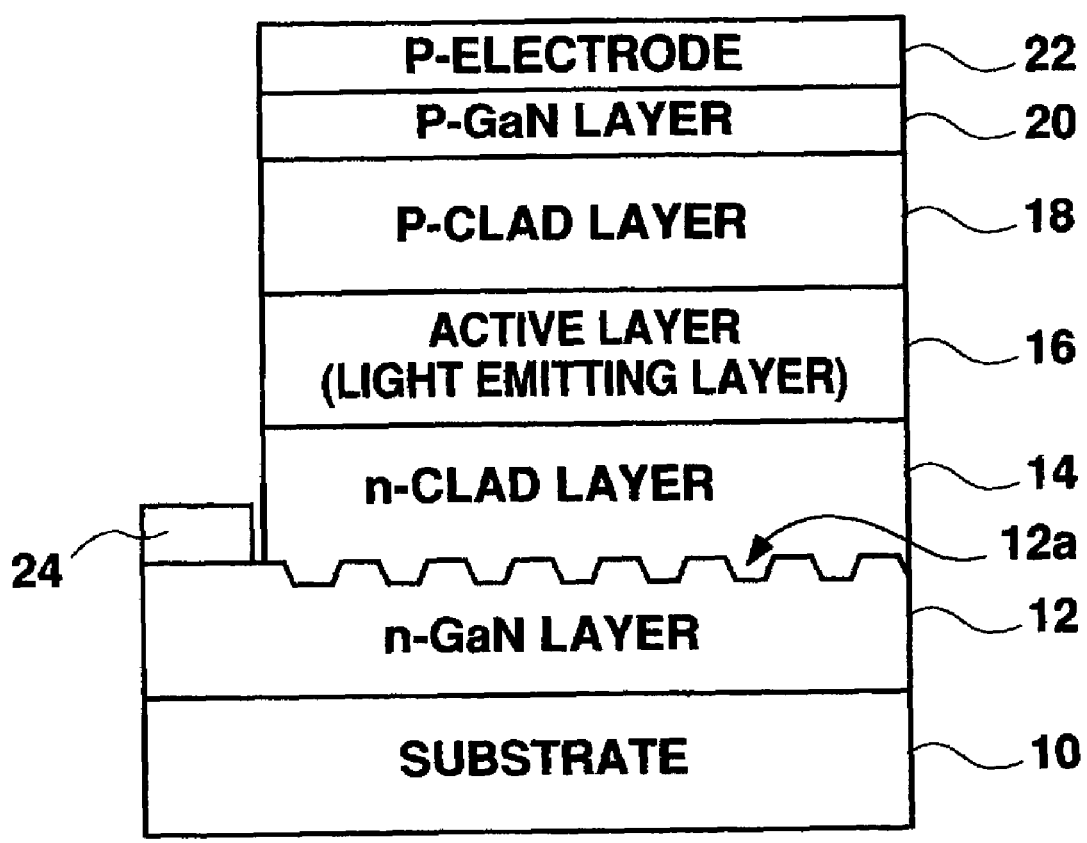
FIG. 1 is a diagram showing a structure of a light emitting device in an embodiment of the present invention.

FIG. 1 is a diagram showing a structure of an embodiment of a GaN-based light emitting device. Specifically, on the substrate 10, there are sequentially formed an n-GaN layer 12, an n-clad layer 14, an active layer (a light emitting layer) 16, a p-clad layer 18, and a p-GaN layer 20. A p-electrode 22 is formed on the p-GaN layer 20, and an n-electrode 24 is formed on a part of the n-GaN layer 12 which is etched to be exposed. The clad layers 14 and 16 each are either a single AlGaN layer or a strained layer super lattice (SLS)

layer constituting of alternately stacked AlGaN and GaN layers. The active layer (light emitting layer) 16 is an InGaN layer or the like. In this embodiment, the surface of the n-GaN layer 12 is not planar but uneven, and the n-clad layer 14 is thus formed on the uneven surface of the n-GaN layer 12. The unevenness of the n-GaN layer 12 can be realized by adjusting a growth time or thickness of the n-GaN layer 12.

Figure 2:
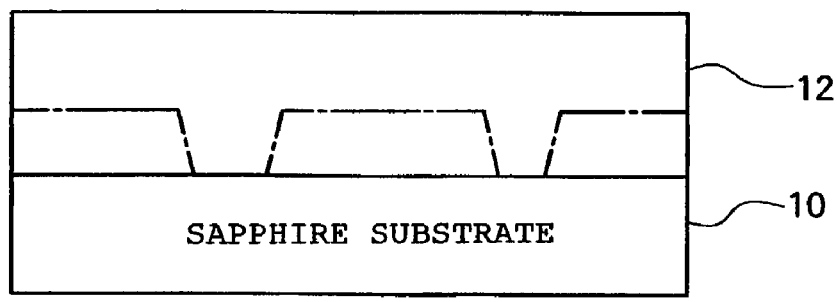
FIG. 2 is a diagram explaining growth of a GaN layer on a substrate.

FIG. 2 shows growth of GaN in formation of an n-GaN layer 12 on the substrate 10. Specifically, in the process of growing GaN on a substrate made of sapphire or the like at 1070° C. using an MOCVD, initially, GaN grows into an island shape, rather than uniformly, (see the dotted (single dot) line in FIG. 2) due to the presence of a region with a coarse crystal lattice along the boundary relative to the substrate 10. As growth proceeds, growth parallel to the direction in which the layer lies (a lateral direction) becomes dominant until a GaN layer 12 is ultimately completed as a continuous film (see the solid line in FIG. 2).

That is, while the n-GaN layer 12 is still thin, the surface of the layer 12 is not yet planar, and island growth can be observed on the surface. In this embodiment, at the stage where the surface of the GaN is yet to be planar, in other words, during the stage of island growth, growth of the n-GaN layer 12 is arrested and an n-clad layer 14 is formed thereon.

Figure 3A:
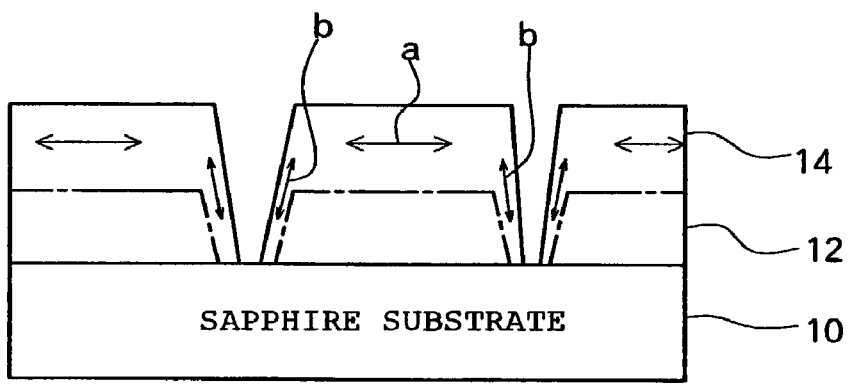
FIG. 3 is a diagram showing growth of an AlGaN layer on a GaN layer, FIG. 3(A) showing an initial stage of growth, and FIG. 3(B) showing completion of growth.
Figure 3B:
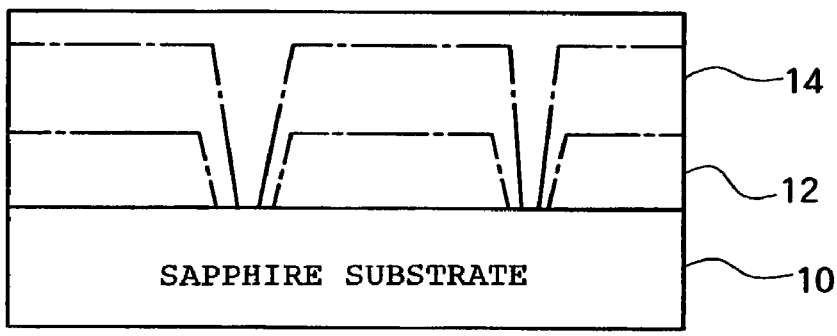

FIGS. 3A and 3B show growth of the n-clad layer 14. In these drawings, an n-GaN layer 12 does not constitute a continuous film or a planar surface in the lateral direction, as shown by the dotted line, with its surface being not-planar but like an island or uneven. The surface of the n-GaN layer 12 is substantially planar when the grown n-GaN layer 12 has grown to have a thickness 1 $\mu$m or greater (for example, 2 $\mu$m) but is rather uneven, or like an island or archipelago, when the thickness is about 0.4 $\mu$m. In the example of this embodiment, an n-clad layer 14 is grown on the n-GaN layer 12 at the stage where its surface is yet to be planar, as shown in FIG. 3A.

Tensile stress is created in respective regions of the n-clad layer 14 (indicated by the arrows a, b in the drawing). The direction of tensile stress caused along the inclined faces of the island portion is not parallel to the direction along which the layer lies. Therefore, although the stress increases as the n-clad layer 14 grows thicker, the compound stress does not increase in proportion to the thickness of the AlGaN layer as the stress is a vector. That is, as in the ultimate state shown in FIG. 3B, the compound stress does not increase, despite the growth in the thickness of the n-clad layer 14, and occurrence of cracks can be prevented.

In this embodiment, because the n-clad layer 14 can be made thicker than was conventionally possible, light or carrier enclosure effect can be further improved. It should be noted that an n-clad layer 14 maybe either a single AlGaN layer or an SLS layer constituting of AlGaN layers and GaN layers.

Figure 4A:
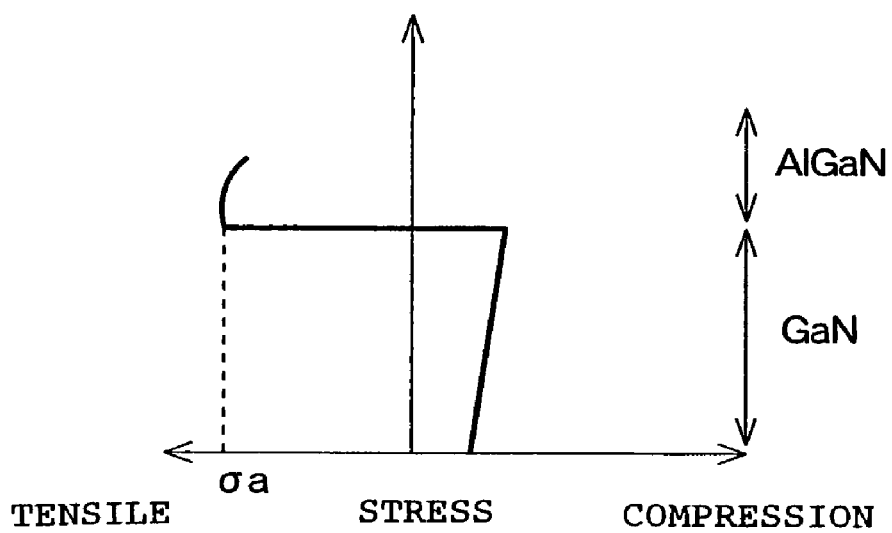
FIG. 4 is a graph showing relationships between stress and thickness of GaN layers, FIG. 4(A) relating to a GaN layer having a non-planar surface, FIG. 4(B) relating to a GaN layer having a planar surface.
Figure 4B:
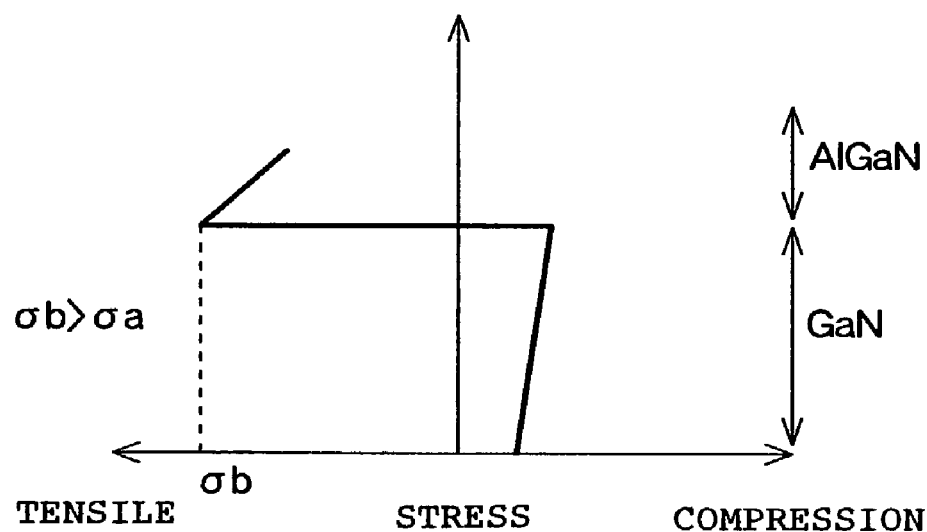
Figure 5:
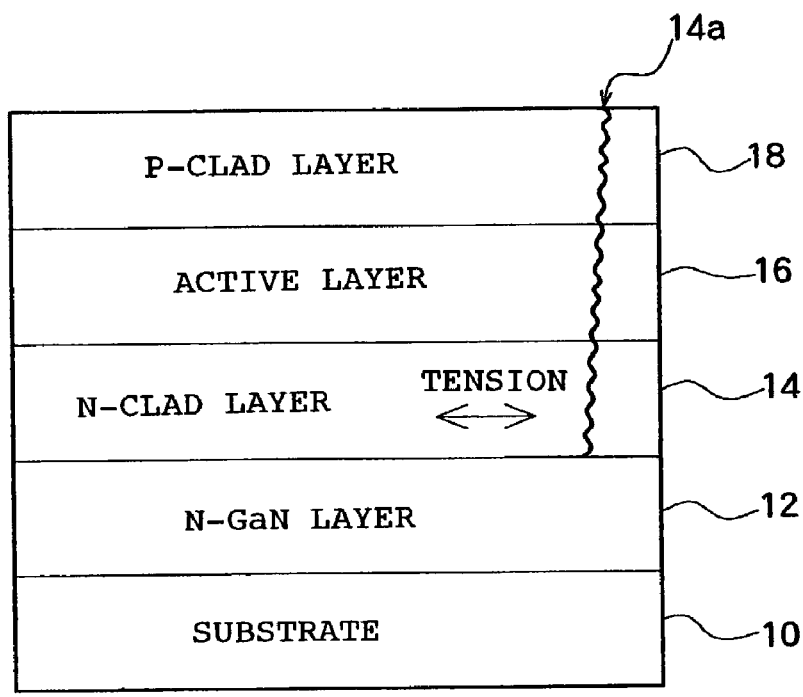
FIG. 5 is a diagram showing a structure of a conventional UV light emitting device.
Figure 6:
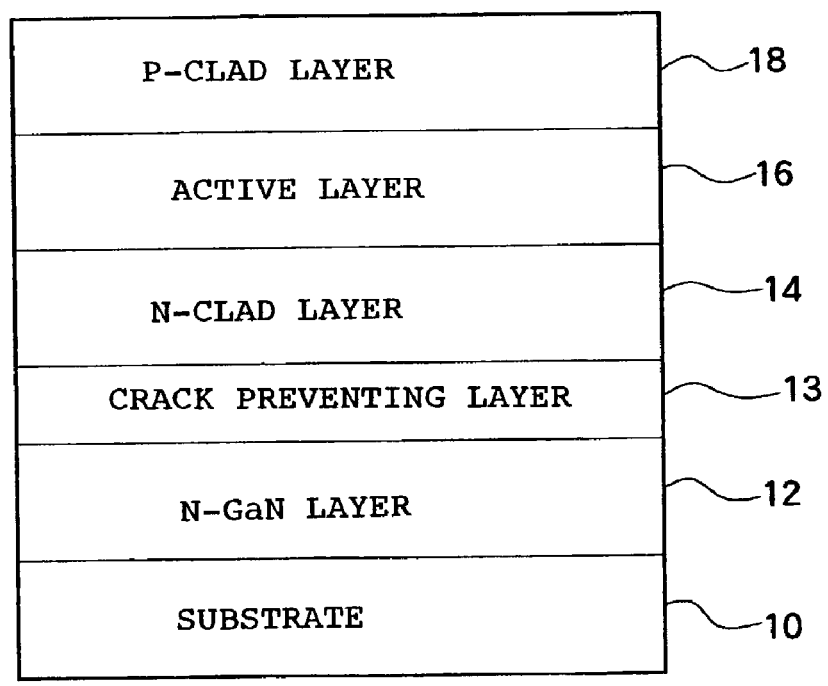
FIG. 6 is a diagram showing a structure of another conventional UV light emitting device.

FIGS. 4A and 4B show changes in stress along the direction of the thickness of the n-clad layer 14, which is an AlGaN layer in this example. FIG. 4A shows stress changes in an example wherein an AlGaN layer is formed on a GaN layer 12 having an uneven or island-shaped surface. FIG. 4B shows stress changes in an example wherein an SLS is formed on a GaN layer 12 having a planar or continuous surface. These drawings show that compressive stress is generated in the GaN layer 12, and the compressive stress is changed to tensile stress at the boundary relative to the n-clad layer 14, so that tensile stress is generated in the n-clad layer 14. In the example of FIG. 4A, because stress changes relatively slowly at the boundary between the n-GaN layer 12 and the n-clad layer 14 crack-causing maximum stress is inhibited. That is, $\sigma a < \sigma b$, wherein $\sigma a$ and $\sigma b$ are the maximum stresses of the n-GaN layer 12 and the n-clad layer 14, respectively, is maintained. In other words, in this embodiment, a critical film thickness of the n-clad layer 14, referring to the maximum thickness in which no cracks are formed, is increased.

In the following, actual examples of application of the present embodiment will be described.

On a sapphire C surface substrate 10, a GaN layer 12 having a thickness t was grown at 1070° C., and an SLS layer 14 of $Al_{0.2}Ga_{0.8}N/GaN$ was formed thereon in N cycles. An MOCVD was used for the growth. Specifically, a sapphire substrate 10 was placed in a reaction tube, and heated to 1150° C. under $H_2$ atmosphere using a heater. Then, trimethylgallium (TMG), $NH_3$, and $H_2$ were introduced into the tube via a gas introducing section for growth of a GaN layer 12, while maintaining the substrate at 1075° C. Thereafter, trimethyl aluminum was further introduced into the tube for growth of an SLS layer 14 of AlGaN/GaN, in which the thickness of each $Al_{0.2}Ga_{0.8}$ layer was 2 nm and that of each GaN layer was 2 nm. After growth was complete, whether or not any cracks were formed on the surface of the n-clad layer 14 was observed using both an optical microscope and an atomic force microscope (AFM). The combination of an optical and AFM microscopic evaluation should detect any cracks, even when none are observed by the naked eye. The observation results are shown in the Table below.

TABLE

| t ($\mu$m) | N | SLS Total Thickness (= 4 nm x N) ($\mu$m) | Presence/absence of Crack |
|---|---|---|---|
| 0.2 | 500 | 2 | Absent |
| 0.4 | 500 | 2 | Absent |
| 0.6 | 450 | 1.8 | Present |
| 2 | 250 | 1 | Present |

As can be seen from the Table, no cracks were observed in thick GaN layers 12, even with thicknesses of 0.2 $\mu$m or 0.4 $\mu$m, and even when the total thickness of the n-clad layer 14 is on the order of 2 $\mu$m. On the contrary, cracks were detected when the n-GaN layer 12 is thick, such as 0.6 $\mu$m or greater, but the total thickness of the n-clad layer 14 was on the order of 1.8 $\mu$m or less. This data provides evidence that formation of an n-clad layer on an n-GaN layer which is still thin, or has yet to be grown thick enough to have a planar surface, rather than on an n-GaN layer 12 which has grown to have a planar surface, as conventionally, enables formation of a thick SLS layer 14 (2 $\mu$m or greater thick), which in turn ensures reliability of the n-clad layer 14. Obviously, a GaN layer 12 can be formed with a thickness 0.2 $\mu$m or 0.4 $\mu$m through adjustment of growth time.

When a single $Al_{0.2}Ga_{0.8}N$ layer, instead of an SLS layer 14, is grown on the GaN layer 12, the critical thickness, the borderline thickness at which no cracks are formed, is approximately ⅓ of the thickness of the SLS. This is believed to be because the average Al composition of the SLS layer 14 is as small as 0.1 and because distortion distributed within the SLS serves to further reduce the stress. The critical thickness of a single AlGaN layer is small compared to an SLS, but large compared to formation on a planar surface of the GaN layer 12.

It is observed that, when a thickness t of a GaN layer 12 is 0.4 $\mu$m or greater, density of dislocation caused within the SLS layer 14 is as low as that for a thickness t of 2 $\mu$m.

However, for a thickness t of a GaN layer 12 of 0.2 µm or less, the dislocation density sharply increases.

In view of the above, it can be known that, in order to ensure preferable crystalline state, the thickness of the GaN layer 12 must be approximately 0.2 µm or greater, preferably approximately 0.3 µm or greater, and that, in order to prevent cracks in the clad layer 14 formed on the GaN layer 12, the thickness is preferably approximately 0.5 µm or less. That is, the relationship 0.2 µm ≦ thickness of GaN layer 12 t ≦ 0.5 µm is maintained. Here it should be noted that the upper limit of the thickness t of the GaN layer 12 may vary depending on the required thickness of the clad layer 14. In order to grow a clad layer 14 having a thickness 2 µm or greater, the upper limit value of the thickness t is 0.5 µm. When a thickness 2 µm or smaller is acceptable for the clad layer 14, the upper limit value of the thickness t is 0.5 µm or greater. That is, the possibility of crack occurrence depends on the thickness of the clad layer 14. An AlInGaN layer may be used for the clad layer 14.

It should also be noted that, although a laser is described in the example this embodiment, the present invention is similarly applicable to an LED and other similar technologies.

What is claimed is:

1. A gallium nitride-based light emitting device, comprising:
    a substrate;
    a GaN-based layer formed on the substrate;
    an AlGaN-based layer formed on the GaN-based layer; and
    a light emitting layer formed on the AlGaN-based layer,
    wherein a surface of the GaN-based layer at a boundary relative to the AlGaN-based layer comprises a plurality of island shapes defining a plurality of inclined faces, such that tensile stress formed in the AlGaN-based layer along the inclined faces of the island shapes is not parallel to a direction along which the AlGaN-based layer lies.

2. A gallium nitride-based light emitting device, comprising:
    a substrate;
    a GaN-based layer formed on the substrate;
    an AlGaN-based layer formed on the GaN-based layer; and
    a light emitting layer formed on the AlGaN-based layer,
    wherein the AlGaN-based layer is formed on the GaN-based layer before a surface of the GaN-based layer has grown to be planar.

3. The gallium nitride-based light emitting device according to claim 1, wherein the thickness of the GaN-based layer is within the range of 0.2 µm to 0.5 µm.

4. The gallium nitride-based light emitting device according to claim 1, wherein the thickness of the AlGaN-based layer is 2 µm or greater.

5. The gallium nitride-based light emitting device according to claim 1, wherein the AlGaN-based layer has a strained layer super lattice in which an AlGaN layer and a GaN layer are alternately stacked.

6. The gallium nitride-based light emitting device according to claim 1, further comprising:
    a second AlGaN-based layer formed on the light emitting layer.

7. The gallium nitride-based light emitting device according to claim 1, further comprising:
    a second AlGaN-based layer formed on the light emitting layer;
    a second GaN-based layer formed on the second AlGaN-based layer;
    a first electrode connected to the GaN-based layer; and
    a second electrode connected to the second GaN-based layer.

8. The gallium nitride-based light emitting device according to claim 7, wherein
    the GaN-based layer is an n-GaN layer,
    the AlGaN-based layer is an n-SLS layer in which an n-AlGaN layer and an n-GaN layer are alternately stacked,
    the second AlGaN-based layer is a p-SLS layer in which an p-AlGaN layer and a p-GaN layer are alternately stacked,
    the second GaN-based layer is a p-GaN layer,
    the first electrode is an n-electrode, and
    the second electrode is a p-electrode.

9. The gallium nitride-based light emitting device according to claim 2, wherein the thickness of the GaN-based layer is within the range of 0.2 µm to 0.5 µm.

10. The gallium nitride-based light emitting device according to claim 2, wherein the thickness of the AlGaN-based layer is 2 µm or greater.

11. The gallium nitride-based light emitting device according to claim 2, wherein the AlGaN-based layer has a strained layer super lattice in which an AlGaN layer and a GaN layer are alternately stacked.

12. The gallium nitride-based light emitting device according to claim 2, further comprising:
    a second AlGaN-based layer formed on the light emitting layer.

13. The gallium nitride-based light emitting device according to claim 2, further comprising:
    a second AlGaN-based layer formed on the light emitting layer;
    a second GaN-based layer formed on the second AlGaN-based layer;
    a first electrode connected to the GaN-based layer; and
    a second electrode connected to the second GaN-based layer.

14. The gallium nitride-based light emitting device according to claim 13, wherein
    the GaN-based layer is an n-GaN layer,
    the AlGaN-based layer is an n-SLS layer in which an n-AlGaN layer and an n-GaN layer are alternately stacked,
    the second AlGaN-based layer is a p-SLS layer in which an p-AlGaN layer and a p-GaN layer are alternately stacked,
    the second GaN-based layer is a p-GaN layer,
    the first electrode is an n-electrode, and
    the second electrode is a p-electrode.

* * * * *

UNITED STATES PATENT AND TRADEMARK OFFICE
CERTIFICATE OF CORRECTION

PATENT NO. : 7,015,511 B2  Page 1 of 1
APPLICATION NO. : 10/184305
DATED : March 21, 2006
INVENTOR(S) : Shiro Sakai et al.

It is certified that error appears in the above-identified patent and that said Letters Patent is hereby corrected as shown below:

On the cover Page

Under section (56) References Cited, OTHER PUBLICATIONS, add --Patent Abstract of Japan Patent No. JP11266004 --.

Signed and Sealed this

Thirtieth Day of January, 2007

JON W. DUDAS
*Director of the United States Patent and Trademark Office*